United States Patent [19]

Steppan et al.

[11] 4,401,520
[45] Aug. 30, 1983

[54] PROCESS FOR THE PREPARATION OF SCREEN PRINTING STENCILS BY AN ELECTROPLATING METHOD

[75] Inventors: Hartmut Steppan, Wiesbaden; Barbara Wildenhain, Walluf; Hans Ruckert, Wiesbaden, all of Fed. Rep. of Germany

[73] Assignee: Hoechst Aktiengesellschaft, Fed. Rep. of Germany

[21] Appl. No.: 244,965

[22] Filed: Mar. 18, 1981

[30] Foreign Application Priority Data

Mar. 22, 1980 [DE] Fed. Rep. of Germany ....... 3011192

[51] Int. Cl.³ .............................................. C25D 1/08
[52] U.S. Cl. ...................................................... 204/11
[58] Field of Search ......................................... 204/11

[56] References Cited

U.S. PATENT DOCUMENTS 2,287,122  6/1942  Norris ................................... 204/11
3,586,609  6/1971  Jansen ................................... 204/11
3,586,610  6/1971  Peter ..................................... 204/11

FOREIGN PATENT DOCUMENTS 2259182  3/1978  Fed. Rep. of Germany ........ 204/11

Primary Examiner—T. M. Tufariello
Attorney, Agent, or Firm—James E. Bryan

[57] ABSTRACT

This invention relates to an improvement in the process for the preparation of screen printing stencils by an electroplating method, which comprises coating a metallic matrix, provided in the manner of a screen with dots of insulating material, with a photoresist layer, exposing the photoresist layer imagewise and developing it by washing out, and rendering those areas of the photoresist layer which have remained in place electrically conductive in the course of imaging, electrodepositing metal up to a desired height on the conductive image stencil and on the matrix ridges surrounding the insulating screen dots, and removing the patterned screen printing stencil thus obtained from the matrix, the improvement which comprises rendering the photoresist layer conductive only on its surface and before developing.

7 Claims, 14 Drawing Figures

PROCESS FOR THE PREPARATION OF SCREEN PRINTING STENCILS BY AN ELECTROPLATING METHOD

The invention relates to a process for the preparation of patterned screen printing stencils by an electroplating method.

Several variations are possible in the galvano-plastic preparation of screens, also for the preparation of printing stencils, and these are described, for example, in the article "Galvanoplastische Siebherstellung" (Galvanoplastic Preparation of Screens) in Metalloberflache 19 (1965), 369–372.

The starting material for the preparation of screened stencils is in general a metallic matrix as the carrier for the metal stencil which is to be electro-deposited. If the matrix is uniformly provided with a screen of dots composed of an electrically non-conductive material, for example plastic, which has been applied by means of photoresist processes or screen printing processes, a stencil having holes with the arrangement and approximate size of the screen dots on the matrix is obtained by electroplating and drawing the metal layer, thus produced, off of the matrix which, if appropriate, has been provided with a stripping layer. In the case of cylindrical round stencils, the screen runs seamlessly around the cylinder surface.

The patterning of screens of this type can be effected by applying either a photoresist stencil or a metal stencil.

The first process which is described, for example, in German Auslegeschrift No. 2,214,728 or German Offenlegungsschrift No. 2,542,430, naturally leads to screen printing stencils giving a lower print run than purely metallic stencils. Attempts have been made to overcome this disadvantage by depositing, without an electric current, a thin metal layer on the metal base and the photoresist stencil which has been rendered conductive (German Offenlegungsschrift No. 2,324,372). In this way, however, it is not possible to obtain the durability of a purely metallic stencil. The second process which is described, for example, in German Offenlegungsschrift No. 2,539,845, requires the application of an additional metal layer, the adhesion of which to the metal screen must meet stringent requirements in order to prevent the detachment of individual elements of the metal stencil from the screen in the course of the printing process. The mechanical wear resistance of a stencil of this type during wiping with the doctor blade is also limited by the imagewise metal stencil which, in most cases, is relatively thin.

Patterned screen printing stencils which can be produced by electroplating in one stage are therefore to be preferred.

A process of this type, in which a copy of an original screened imagewise is produced on a photoresist layer and the developed photoresist layer is used directly as the stencil for the metal deposition, is described in German Auslegeschrift No. 2,640,268. When round stencils are to be prepared by this process, it is in general not possible to transfer the screen pattern to the cylinder without a seam which corresponds to the ends of the original. Although this process makes possible an exact reproduction of the size of the screen dots by a correspondingly differing width of the screen openings, color densities which are true to the original are in general not obtained when printing from screen printing stencils having such screens of variable surface area, because the narrower openings have a more than proportionally greater resistance to the passage of the printing ink, as compared with excessively wide openings.

A process for the preparation of screen printing stencils which are composed of a superposition of an image pattern and a screen having openings of equal diameter, by electroplating in one stage is described in German Auslegeschrift No. 2,051,728, columns 1 and 2. In this case, a cylindrical matrix of metal, which has a recessed screen filled with electrically insulating material, is coated with a light-sensitive negative layer which becomes or can be rendered conductive by exposure, and the layer is exposed and developed. Metal is electrodeposited on the patterned matrix thus obtained, both on the image areas of the photoresist layer, which have been rendered conductive, and on the metal ridges which surround the insulating screen dots of the matrix. The patterned screen printing stencil obtained is then taken off the matrix. The disadvantage of this process, mentioned in the printed publication, is that, due to the thickness of the stencil produced galvanoplastically, the openings above the plastic screen dots gradually close up, that is to say the radius of the openings decreases by an amount proportional to the thickness of the layer. To overcome this disadvantage, a process is recommended in the printed publication, wherein wire windings are fitted side by side at a spacing above the matrix which is covered with the photoresist and is to be electroplated, and are embedded during electroplating into the deposited metal which then needs only to have a lower layer thickness. This process requires very precise fitting of the wire windings and has not gained acceptance in practice. Rather, it has proved to be more readily feasible to obtain the desired hole size by selecting insulating screen dots on the matrix, which are greater by a corresponding amount; that is readily possible in the case of screen dots of uniform size.

Another disadvantage of this process, however, is that the photoresist layer must contain an adequate quantity of additives which become conductive by exposure, as described, for example, in German Auslegeschrift No. 1,771,876. The photoresist layer described in this publication contains a large quantity of metal salts which are sparingly soluble in water and which are reduced to the metal during exposure. The metal salts, for example those of silver, copper or zinc, increase the costs of the light-sensitive mixture and, moreover, can adversely affect the other properties thereof, in particular the light sensitivity and the resistance of the light-hardened layer to the electroplating baths which in most cases are very aggressive. Additionally, inasmuch as the reduction to the metal is an effect of exposure, a relatively intense and long exposure is necessary in order to produce an electrical conductivity on the surface which is adequate for the electroplating.

It is the object of the invention to provide a process for the preparation of screen printing stencils, described last above, by electroplating, in which process the photoresist layer in its bulk does not contain any additives for rendering it conductive and which is simpler and more reliable and can preferably be carried out with the use of less expensive materials.

The starting point of the invention is a process for the preparation of screen printing stencils by an electroplating method, in which a metallic matrix provided with dots of insulating material in the manner of a screen is coated with a photoresist layer, the photoresist layer is exposed imagewise and developed by washing out, and those areas of the photoresist layer which have remained in place are rendered electrically conductive in the course of imaging, metal is electrodeposited up to the desired height on the conductive image stencil and on the matrix ridges surrounding the insulating screen dots, and the patterned screen printing stencil thus obtained is removed from the matrix.

In the process according to the invention, the photoresist layer is rendered conductive only on its surface and before developing.

The surface can be rendered conductive in known manner by generating noble metal nuclei and by metal deposition, which can be carried out without an electric current if appropriate, on these nuclei in a manner similar to that described in German Offenlegungsschrift No. 2,324,372. This can be carried out by vapor deposition of thin layers of conductive materials, for example of metals, or by mechanical application of conductive particles, for example by rubbing-in of powders or pastes.

If the conductive material absorbs light in the actinic range of the photoresist layer, it is advantageous to render the surface conductive only after the exposure of the photoresist layer.

Within the scope of the process according to the invention, the application of a layer of conductive particles, either in the form of a dispersion or—preferably—as a dry powder has proved to be particularly simple and effective.

Examples of suitable conductive particles are metal powders, conductive metal compounds, carbon black and graphite. Graphite is particularly preferred. The particles can be applied mechanically, advantageously by rubbing with a suitable material, for example a dabber or pad, in the form of a dry, finely particulate powder to the surface of the photoresist layer, to give a uniform, continuous, firmly adhering layer. They also can be applied in the form of a dispersion in a solvent, if appropriate with the addition of minor amounts of organic binders or wetting agents, and can be rubbed in on the surface.

Rendering the surface of photoresist layers conductive by the application of graphite, for the purpose of a later electrodeposition of metal, is known from German Offenlegungsschrift No. 1,772,590, Example 26. In the latter, however, rubbing in of graphite is primarily used for rendering a latent image visible. The graphite which acts on the surface in conjunction with kerosene is retained predominantly in the unexposed areas of the surface and gives a visible image. Washing out of the non-image areas of the layer does not occur. It is evident that the areas hardened by exposure take up little graphite or none at all at these points. It is therefore surprising that, in the process according to the invention, precisely the less soluble photoresist layer areas take up the graphite by intense rubbing in so readily that, even after washing out of the more readily soluble areas with a developer, such a dense conductive layer still remains that a continuous, defect-free metal layer can be electrodeposited thereon.

The metallic matrices used in the process according to the invention are either smooth foils, preferably of nickel, to which raised non-conductive dots, preferably of plastic, have been applied in screen-like distribution. The application can be carried out by the screen printing process or the photoresist process. Alternatively, the matrix can be provided with depressions or perforations in a screen-like distribution, which are filled with a non-conductive plastic up to the surface of the matrix. This embodiment is particularly suitable for the preparation of seamless round stencils, if present in the form of cylinders, as described in German Auslegeschrift No. 2,051,728, column 1.

A photoresist layer which can be processed by exposure and developing with a suitable developer fluid, to give a relief-type image, is applied in the conventional manner to a matrix. Both negative-working resists which can be hardened by light and resists which are rendered soluble by light, that is to say positive-working resists, are suitable, the latter being preferred.

Suitable negative-working photoresist materials are those composed of photopolymerizable mixtures of polymerizable ethylenically-unsaturated compounds, polymeric binders and photoinitiators, of light-crosslinkable compounds, such as polyvinyl cinnamate, or of negative-working diazo compounds or azido compounds, if appropriate as a mixture with binders.

Suitable positive-working light-sensitive mixtures are those composed of o-quinone-diazides and alkali-soluble resins, in particular phenolic resins, or of compounds which can be split by acid, such as orthocarboxylic acid esters or acetals, and of compounds which photolytically form an acid, if appropriate as a mixture with alkali-soluble resins, in particular phenolic resins.

The photoresist layers can be applied in known manner, either by coating from a solution or by lamination of a prefabricated solid layer under pressure and with heating.

Light-sensitive photoresist layers which can be developed with dilute aqueous-alkaline solutions are preferred.

The photoresist layer is exposed in the conventional manner under an original of the image stencil. As already mentioned, the layer can be provided with the conductive surface before or after exposure. Because the conductive substances usually absorb light in the spectral region in which the photoresist layer is light-sensitive, the conductive substance preferably is applied after the image exposure. Although it was to be expected that the conductive substance would be taken up particularly extensively in precisely those layers areas which are removed by the development, these areas can be removed together with the conductive covering layer without problems, in particular if the preferred aqueous-alkaline developer solutions are used.

On the other hand, the conductive layer remains to such an adequate extent on the residual layer areas that it forms a firmly adhering, dense fault-free conductive surface. An excess of conductive substance, which may be present, then can be flushed off.

An imagewise modified matrix is thus obtained, which comprises the conductive photoresist stencil and the conductive metal ridges of the metal matrix which have been bared by the development and which surround the non-conductive plastic screen dots, as well as these non-conductive screen elements.

This matrix is then electroplated, preferably electroplated with nickel. The electroplating starts on the bared metal surface of the matrix and on the conductive resist layer and, at the edges thereof, the metal grows together with the adjacent screen ridges. Depending on the desired stencil thickness, closing-up of the areas covered with plastic screen dots can be compensated by an appropriate selection of the size, form and spacing of these dots. This embodiment is illustrated by FIGS. 1–7 of the accompanying drawings.

In the other embodiment of the process, referred to above, the starting materials are elastic flat or round matrices having a smooth surface to which raised non-conductive dots or spots of plastic have been applied in a screen-like arrangement. The plastic used is preferably a tough material which is not deformable by heat, for example, a cured epoxy resin. For the preparation of flat stencils, rather thick prefabricated resist layers are preferably laminated under pressure and with heating to the matrix and are uniformly distributed between the dots. In this procedure, closing-up of the holes in the stencil is greatly reduced by the fact that growth over the holes can start only above the level of the screen dots. This embodiment is illustrated by FIGS. 8–14 of the accompanying drawings.

FIGS. 1 to 7 of the drawings illustrate the preparation of a screen printing stencil according to the first indicated embodiment of the process according to the invention.

Figure 1:
FIG. 1 shows a nickel matrix 1 having depressions which are in a screen-like arrangement and are filled with a non-conductive plastic 2.
Figure 2:
FIG. 2 shows the matrix, according to FIG. 1, which is coated with a negative-working photoresist layer 3.
Figure 3:
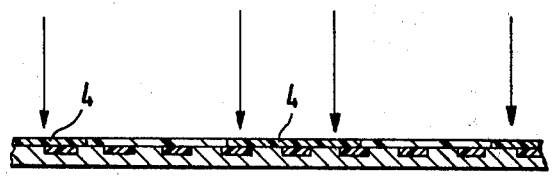
FIG. 3 shows the same matrix which is exposed imagewise in the areas 4 of the photoresist layer.
Figure 4:
FIG. 4 shows the matrix which has been exposed and covered with a conductive powder 5.
Figure 5:
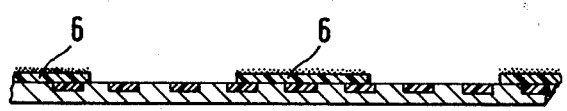
FIG. 5 shows the same matrix after development, after which the light-cured photoresist stencil 6 remains, which is covered with the powder layer.
Figure 6:
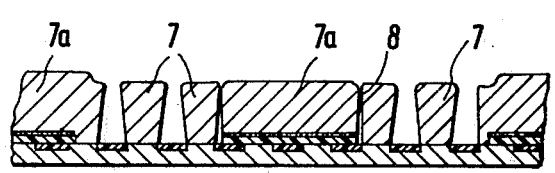

FIG. 6 shows the matrix after the electrodeposition of metal on its conductive surface area. In the image areas not covered by the photoresist stencil, metal ridges 7 are here formed, which surround the non-conductive screen dots 2. Moreover, imagewise arranged stencil elements 7a are formed over the photoresist stencil. Metal ridges 7 which are located in the immediate vicinity of stencil elements 7a, grow together with the latter at the contact points 8.

Figure 7:
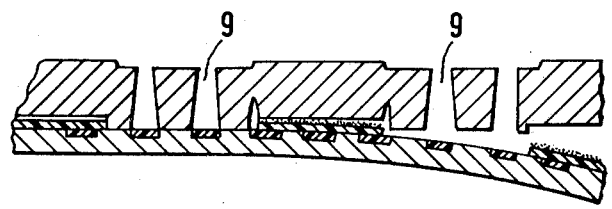

FIG. 7 shows the finished screen printing stencil with the matrix already partially stripped off. When the stencil is used, printing ink is forced through the openings 9 which are in an imagewise distribution.

Another embodiment of the process is represented in FIGS. 8 to 14.

Figure 8:
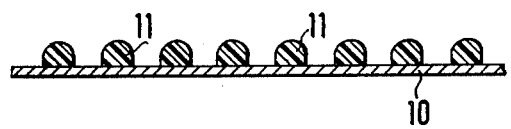

FIG. 8 shows a nickel matrix 10 having a smooth surface on which dots of a non-conductive plastic 11 are arranged in the manner of a screen.

Figure 9:
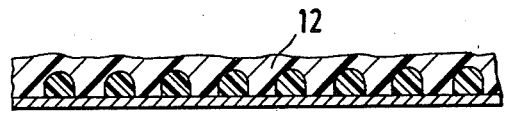

FIG. 9 shows the matrix with a positive-working dry resist layer 12 laminated thereto under the action of pressure and heat.

Figure 10:
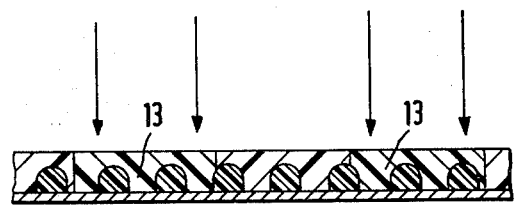

FIG. 10 shows the same matrix after exposure at the image areas 13.

Figure 11:

FIG. 11 shows the matrix after it has been exposed and coated with a conductive powder layer 14.

Figure 12:
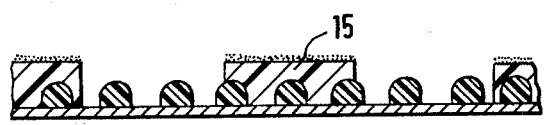

FIG. 12 shows the matrix after development, those stencil areas 15 of the photoresist layer remaining which have not been exposed and have been covered with a conductive powder layer.

Figure 13:
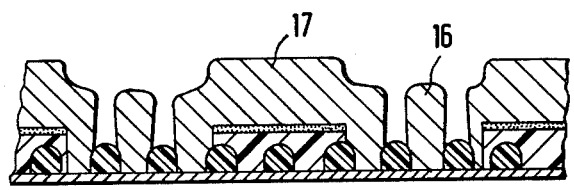

FIG. 13 shows the matrix after the electrodeposition of metal. Again, metal ridges 16 in the image areas and stencil elements 17 have been formed, the edges of which have grown together with adjacent ridges 16.

Figure 14:
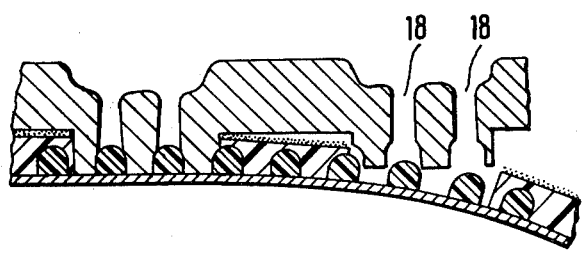

FIG. 14 shows the finished metal stencil from which the matrix has been partially stripped off. On printing, the openings 18 correspond to the image elements.

The examples which follow illustrate preferred embodiments of the process according to the invention. Quantitative ratios and percentages are to be understood in weight units, unless otherwise stated. Parts by weight (p.b.w.) and parts by volume (p.b.v.) are in the same relationship as the g and the ml.

EXAMPLE 1

The starting material for the preparation of a rotary nickel stencil was a cylindrical nickel matrix 1 which was provided with a conductive stripping layer by treatment with dilute chromic acid and which was provided, in the manner of a screen, with depressions which were filled with a non-conductive epoxy resin 2 insoluble in ethanol. A solution of 1 part by weight of 4,4′-diazido-stilbene-2,2′-disulfonic acid and
2 parts by weight of a polyamide composed of hexamethylenediamine and adipic acid in
90 parts by weight of ethanol and
10 parts by weight of water was then uniformly applied in a thickness of about 2 μm by means of a spray gun which runs along the rotating cylinder on a spindle. After drying of the negative photoresist layer 3, the cylinder was exposed under a positive original of the motif to be printed. The exposed surface was dusted with finely pulverulent, chemically pure molybdenum sulfide, as used as an industrial lubricant, and the surface took up this sulfide as a dense, firmly adhering coating 5. On developing of the layer with ethanol, the conductive coating remained adhering to the exposed areas 4, densely and without gaps, and it was removed with the layer from the unexposed image parts.

Subsequently, nickel was electrodeposited both over the photoresist stencil 6 which had been made conductive and over the bared metal ridges of the matrix 1, until the desired wall thickness for a rotary stencil of this type had been reached. No metal was built up over the epoxy resin spots 2 in a screen-like distribution on the surface of the matrix. Thus, the holes 9, through which later the screen printing ink was printed, were formed in the image parts of the electroplated stencil.

The patterned stencil was stripped off the nickel matrix and washed with an organic solvent in order to clean away adhering residues of photoresist and molybdenum sulfide.

EXAMPLE 2

The starting material for the preparation of a metallic flat screen printing stencil was a nickel foil 10 to which screen dots 11 having a diameter of about 40 μm and a height of 30 μm and being composed of an alkali-insoluble, non-conductive cured epoxy resin had been applied by the screen printing thick film technique. A softenable positive dry resist layer 12 of about 38 μm thickness was laminated thereto under pressure and with heating. The layer was composed of 75% of a cresol/formaldehyde novolak (melting range 105°–120° C.), 20% of methyl 2,4- bis-(diphenoxy-methoxy)-benzoate and 5% of naphthoquinone-(1,2)-diazide-(2)-4-sulfonic acid chloride, and it was applied to a support film of polyethylene terephthalate. The thermoplastic light-sensitive layer 12 then flowed and enveloped the screen dots. After cooling, the support film was stripped off the largely levelled resist surface; the latter was dried again for a short period and exposed under a line negative of the motif to be printed.

Subsequently, pulverulent conductive furnace carbon black having 1% of volatile constituents and a structure (adsorption of dibutyl phthalate) of 119 cm$^3$/100 g was applied and uniformly distributed mechanically, and the excess was blown off or drawn off. After development of the photoresist layer covered with the carbon black layer 14, a relief of dusted resist layer 15 and raised plastic screen dots 11 on the nickel foil 10 was obtained. An approximately 60 μm thick nickel layer was then electrodeposited thereon. The nickel layer was composed of ridge-type parts 16 in the zone of the image areas which started directly on the surface of the nickel matrix, and of stencil parts 17 in the zone of the non-image areas which started from the resist surface 15 which had been rendered conductive. In the zone of the resist edges, the parts 16 and 17 grew together to form common relief elements. Due to the relatively great height of the non-conductive plastic screen dots, closing-up of the holes 18, due to electroplating, starts only comparatively later than in the case of recesses or perforation holes in the nickel matrix, which have been surface-ground and filled with plastic.

Instead of using carbon black powder, the surfaces also can be rendered conductive by means of a paste. For this purpose, a commercially available electrophotographic toner was stirred up with a little wetting agent and gasoline to give a paste which can be diluted as desired, and this was spread on the exposed copying layer, this paste drying on very rapidly. The toner used was a mixture of 85% by weight of an 80:20 styrene/butyl methacrylate copolymer and 15% of conductive carbon black, and the wetting agent used was a reaction product of nonylphenol and ethylene oxide.

EXAMPLE 3

A nickel matrix having 24 hexagonal holes per cm, which were smoothly filled with a non-conductive cured epoxy resin, was coated with a positive resist of the following composition:

24 parts by weight of the novolak as in Example 2,
4 parts by weight of the esterification product obtained from 1,2-naphthoquinone-2-diazide-5-sulfonic acid chloride and 2,3,4-trihydroxy-benzophenone and
0.1 part by weight of crystal violet in
50.3 parts by weight of 1,1,1-trichloroethane,
14.4 parts by weight of isopropanol and
7.2 parts by weight of butyl acetate and the coating was dried to give a layer of about 2–6 μm thickness. Subsequently, the coated matrix was sufficiently exposed under a negative line original of the desired motif, and a dabber or pad charged with finely pulverulent graphite was then uniformly wiped over the exposed surface in such a way that uniform, dense dusting resulted. The copying layer rendered superficially conductive was removed from the exposed surface zones by means of a developer composed of 5.5% of sodium metasilicate 9H$_2$O,
3.4% of trisodium phosphate.12H$_2$O,
0.4% of monosodium phosphate (anhydrous) and
90.7% of water, rinsed with water and dried. The graphite layer did not impede development, but it adhered strongly to the areas which had not been exposed nor developed.

Finally, nickel was deposited in a commercially available nickel plating bath, for example, a Ni sulfamate bath, up to the desired thickness of about 0.1 mm of nickel. The deposition started at the bared metal areas of the matrix which had been provided, as is customary, with a conductive stripping layer. At the same time, electroplating also started on the areas which had been rendered conductive so that a coherent nickel surface formed in the non-image areas. After stripping off the stencil produced by electroplating, any residues of resist and powder were cleaned away and the stencil was set up for printing. The ink was transferred to the printing carrier through the surface parts provided imagewise with holes.

EXAMPLE 4

A screen printing lacquer of the following composition 40 parts by weight of a 50% concentration aqueous dispersion of a vinyl acetate copolymer,
80 parts by weight a polyvinyl alcohol (K value 26, 12% of residual acetyl groups),
3 parts by weight of a condensation product obtained from 3-methoxy-diphenylamine-4-diazonium salt and formaldehyde, prepared in 85% concentration phosphoric acid and introduced as the crude condensate, and
280 parts by weight of water was applied by means of a suitable circular doctor blade to a cylindrical nickel matrix which was uniformly perforated and filled with epoxy resin, and was dried to give a 10 μm thick layer. After exposure under a positive original, the entire cylinder surface was mechanically treated with a 1:1 mixture of graphite and molybdenum sulfide and was thinly and densely covered with this mixture. Subsequently, the unexposed, imagewise layer parts including the conductive layer adhering thereto were removed in the conventional manner by swelling and rinsing with tap water, and the matrix metal and the screen holes therein, filled with plastic, were thus bared. By electroplating with nickel up to the desired thickness and stripping off the nickel skin thus formed, a usable round stencil which was suitable for the printing of textiles and paper by rotary screen printing was obtained in a relatively simple manner.

EXAMPLE 5

The procedure followed was as in Example 2, and the matrix indicated there was laminated, under pressure and with heating, with a 50 μm thick negative dry resist layer located on a 25 μm thick support film of polyethylene terephthalate and having the following composition:

42.7% of a terpolymer of n-hexyl methacrylate, methacrylic acid and styrene (60:30:10) having a mean molecular weight of about 35,000,
36.7% of a polymerizable diurethane which was obtained by reacting 1 mole of 2,2,4-trimethylhexamethylene diisocyanate with 2 moles of hydroxyethyl methacrylate,
1.3% of 9-phenyl-acridine,
0.6% of 3-mercapto-propionic acid 2,4-dichloroanilide,
0.2% of a blue azo dye, obtained by coupling of 2,4-dinitro-6-chloro-benzene-diazonium salt with 2-methoxy-5-acetylamino-N-cyanoethyl-N-hydroxyethyl-aniline and
18.4% of 2-ethyl-hexyl-4-hydroxy-benzoate, the layer being put in place in contact with the matrix surface of screen-like structure. The photopolymer layer was exposed through the support film under a positive original, and subsequently the support film was stripped off. By dusting with a 1:1 mixture of graphite and conductive carbon black having a specific surface (BET) of 200 m$^2$/g, a structure (DBP) of 110 cm$^3$/100 g and 2.0% of volatile constituents, a uniform, dense conductive surface was similarly produced. This surface was developed imagewise by spraying with a 0.8% concentration sodium carbonate solution. After rinsing, drying, electroplating and stripping off the nickel skin, a usable screen printing stencil was obtained.

It will be obvious to those skilled in the art that many modifications may be made within the scope of the present invention without departing from the spirit thereof, and the invention includes all such modifications.

What is claimed is:

1. A process for the preparation of screen printing stencils which comprises coating a metallic matrix, provided in screen-like arrangement with dots of insulating material, with a photoresist layer, exposing the photoresist layer imagewise, thereafter rendering the surface of the photoresist layer electrically conductive by the application of conductive particles, subsequently developing the photoresist layer by washing out, electrodepositing metal up to a desired height on the conductive image stencil and on the matrix ridges surrounding the insulating screen dots, and removing the patterned screen printing stencil thus obtained from the matrix.

2. A process as claimed in claim 1, including using graphite powder as the conductive particles.

3. A process as claimed in claim 1, including using a photoresist layer which becomes soluble by exposure.

4. A process as claimed in claim 1, including using a cylindrical matrix.

5. A process as claimed in claim 1, in which the matrix used has depressions or perforations which are arranged in the form of a screen and are filled with a non-conductive material.

6. A process as claimed in claim 1, in which the matrix used has a flat surface on which screen dots of a non-conductive material have been placed.

7. A process as claimed in claim 1, including producing the screen printing stencil by electrodeposition of nickel.

* * * * *